US011362570B2

(12) United States Patent
Schalowski et al.

(10) Patent No.: US 11,362,570 B2
(45) Date of Patent: Jun. 14, 2022

(54) CONTROL UNIT FOR ACTIVATING A DRIVE DEVICE, MOTOR UNIT INCLUDING A DRIVE DEVICE AND A CONTROL UNIT AND METHOD FOR MANUFACTURING A MOTOR UNIT

(71) Applicant: Robert Bosch GmbH, Stuttgart (DE)

(72) Inventors: Gerhard Schalowski, Dettingen (DE); Raphael Segiet, Reutlingen (DE); Volker Weeber, Lauffen (DE)

(73) Assignee: Robert Bosch GmbH, Stuttgart (DE)

( * ) Notice: Subject to any disclaimer, the term of this patent is extended or adjusted under 35 U.S.C. 154(b) by 274 days.

(21) Appl. No.: 16/611,039

(22) PCT Filed: Mar. 22, 2018

(86) PCT No.: PCT/EP2018/057321
§ 371 (c)(1),
(2) Date: Nov. 5, 2019

(87) PCT Pub. No.: WO2018/215120
PCT Pub. Date: Nov. 29, 2018

(65) Prior Publication Data
US 2021/0288559 A1  Sep. 16, 2021

(30) Foreign Application Priority Data

May 24, 2017  (DE) .......................... 102017208864.8

(51) Int. Cl.
*H02K 11/33* (2016.01)
*H02K 11/01* (2016.01)
*H05K 7/14* (2006.01)

(52) U.S. Cl.
CPC ......... *H02K 11/33* (2016.01); *H02K 11/0141* (2020.08); *H05K 7/1432* (2013.01)

(58) Field of Classification Search
CPC ...... H02K 11/33; H02K 11/215; H02K 11/38; H02K 11/00; H02K 5/225; H02K 5/10;
(Continued)

(56) References Cited

U.S. PATENT DOCUMENTS

2002/0047504 A1    4/2002  Takahashi
2014/0354117 A1*  12/2014  Ishihara ................. H02K 15/14
                                                              310/67 R
2017/0077631 A1*   3/2017  Mitteer ................ H01R 12/737

FOREIGN PATENT DOCUMENTS

CN    104139389 B    4/2016
DE    19723664 A1    12/1997
(Continued)

OTHER PUBLICATIONS

International Search Report for PCT/EP2018/057321, dated Jun. 27, 2018.

*Primary Examiner* — Bryan R Perez
(74) *Attorney, Agent, or Firm* — Norton Rose Fulbright US LLP; Gerard Messina

(57) ABSTRACT

A control unit for activating a drive device, the control unit including at least one circuit board to be contacted by at least one connecting element of the drive device, which includes at least one lead-through for the connecting element, and is contactable from a contacting side via the at least one connecting element with the drive device, the contacting side facing away from the drive device. Also described is a corresponding motor unit including a control unit and a drive device, and a manufacturing method for manufacturing a motor unit.

13 Claims, 5 Drawing Sheets

(58) Field of Classification Search
CPC .......... H02K 9/22; B62D 5/0406; B62D 5/04; B62D 5/0403
See application file for complete search history.

(56) References Cited

FOREIGN PATENT DOCUMENTS

| | | |
|---|---|---|
| DE | 102016212585 A1 | 1/2017 |
| EP | 1523087 A1 | 4/2005 |
| EP | 2615725 A2 | 7/2013 |
| JP | S5425145 A | 2/1979 |
| JP | 2008206373 A | 9/2008 |
| JP | 2013198333 A | 9/2013 |
| JP | 2015115969 A | 6/2015 |
| JP | 2016072999 A | 5/2016 |
| JP | 2017077150 A | 4/2017 |

\* cited by examiner

CONTROL UNIT FOR ACTIVATING A DRIVE DEVICE, MOTOR UNIT INCLUDING A DRIVE DEVICE AND A CONTROL UNIT AND METHOD FOR MANUFACTURING A MOTOR UNIT

FIELD OF THE INVENTION

The present invention relates to a control unit for activating a drive device, a motor unit including a drive device, and a control unit and method for manufacturing a motor unit.

BACKGROUND INFORMATION

The unpublished patent application DE 10 2016 212 585 A1 discusses a motor device, including an electric motor and control electronics. The control electronics are configured to control an operation of the electric motor. The motor housing of the motor device in this configuration is fastened via an adhesive connection to the electronics housing of the control electronics.

SUMMARY OF THE INVENTION

The control unit for activating a drive device according to the present invention includes a circuit board, which is to be contacted by at least one connecting element of the drive device. The circuit board includes at least one lead-through, through which the at least one connecting element may be fed. The circuit board further includes a contacting side from which the circuit board is contactable by the connecting element. The contacting side of the circuit board in this case faces away from the drive device.

The control unit may, for example, be a control unit of a brake booster, which is drivable with the aid of an electric motor.

The electric motor in this case may constitute the drive device. The drive device, i.e., the electric motor as well as the associated control unit, must be brought into electrically conductive contact with each other. A control unit generally includes a circuit board. The circuit board of the control unit has a side that faces away from the electric motor. It may be necessary to contact the circuit board from the side facing away. To ensure this, the circuit board includes the aforementioned opening or also a lead-through, through which the at least one connecting element may be fed in each case.

In this way, a contacting of the circuit board on the rear side is possible, even if the drive device, i.e., the motor, is to be installed from a front side of the circuit board. In this way, a contacting of the motor by the control unit may advantageously take place in a space-saving manner and adapted to structural requirements.

It may be advantageous if for each connecting element that is required for contacting the motor, an assigned lead-through is also provided in the circuit board in each case. A lead-through may also be provided in the circuit board, through which two or multiple connecting elements may be fed.

In another advantageous embodiment of the control unit, the at least one lead-through is configured in such a way that the at least one connecting element may be fed from a mounting side of the circuit board through the at least one lead-through of the circuit board to the contacting side. The mounting side in this case faces the circuit board of the drive device. This makes it possible for the at least one connecting element, which is to be connected to the circuit board, to be able to pass from one side of the circuit board to the other side of the circuit board.

In one advantageous embodiment of the control unit, the control unit also includes at least one deflection arrangement. The deflection arrangement in this embodiment is situated in the control unit on the contacting side of the circuit board. Thus, the deflection arrangement is located on the side of the circuit board that faces away from the drive device. Depending on the number of connecting elements provided, it is possible to provide a corresponding number of deflection arrangements in the control unit.

The deflection arrangement in this case may on the one hand be contacted—for example, at a first end—by the circuit board from the contacting side of the circuit board, and on the other hand by the at least one connecting element of the drive device—for example, at another end. A deflection arrangement may be understood to mean an electrically conductive component, which is installed and/or situated in the control unit. Such components may be pins or stamped parts, made of metal or sheet metal, suitably forming a deflection arrangement as one piece or as multiple pieces joined together.

In one area—in particular, at one end—of the at least one deflection arrangement, the deflection arrangement is connected to the circuit board in an electrically conductive manner, in a second area—for example, at another end—of the deflection arrangement, the deflection arrangement may be connected to the connecting element if the connecting element is fed through the opening in the circuit board. The deflection arrangement allows for an electrical connection between an assigned connecting element and the circuit board, the electrical connection experiencing a deflection from a preferential direction of the connecting element in relation to the circuit board.

In one advantageous embodiment, the control unit, in particular, the housing of the control unit, includes a receptacle for the at least one deflection arrangement. The underside of the control unit in this case may include the receptacle for the deflection arrangement. In this way, the deflection arrangement, encompassing, for example, electrically conductive pins or contact pieces, is mounted and/or supported in the underside of the housing. Since forces are applied during assembly when the deflection arrangement is contacted by the connecting element, it is advantageous to stably mount the deflection arrangement in the housing of the control unit and to also support it there. The housing is thus able to support excessively high forces during assembly and damages during assembly may be avoided.

It is further advantageous that the at least one deflection arrangement includes a separate contacting area, which is configured for contacting the at least one connecting element. The at least one receptacle for the at least one deflection arrangement further includes a contacting receptacle, which accommodates the contacting area of the deflection arrangement. This enables a more precise positioning of the contacting area of the deflection arrangement in the contacting receptacle.

It is further advantageous that the at least one connecting element may also be at least partly accommodated in the area of the contacting receptacle of the housing. This also enables an exact positioning of the connecting element in the housing of the control unit.

It is further advantageous that the contacting area of the deflection arrangement is contacted by at least one connecting element in the area of the contacting receptacle.

The contacting in one advantageous embodiment of the present invention takes place by pressing the at least one connecting element onto the contacting area of the deflection arrangement in the area of the contacting receptacle. The pressing-on results in a stable and solid electrically conductive connection between the connecting element and the deflection arrangement. This advantageously enhances the stability of the connection and the electrical contacting. The pressing of the contact element onto the contacting area of the deflection arrangement in the contact receptacle may also be understood as a plug connection.

The at least one connecting element of the electric motor is introduced through at least one housing opening into the interior of the housing of the control unit. The housing opening in this case is located on the mounting side of the circuit board. In this way, it is possible for the at least one connecting element of the motor to pass into the housing interior before, coming from the mounting side of the circuit board, it passes through the opening or also the lead-through of the circuit board to the contacting side of the circuit board to the deflection arrangement.

A motor unit according to the present invention includes a drive device, as well as a control unit which, according to the present invention, includes a circuit board, which is contactable as described.

The present invention further includes a method for manufacturing a motor unit, which includes a control unit and a drive device. The control unit in this case includes a circuit board to be contacted by at least one connecting element of the drive device. The circuit board includes at least one lead-through for the at least one connecting element.

The manufacturing method includes a contacting of the circuit board by the drive device via the at least one connecting element from a contacting side of the circuit board. The contacting side in this case faces away from the drive device. The connecting element in this case is fed through the at least one lead-through of the circuit board.

In one embodiment of the manufacturing method, the at least one connecting element is guided through the lead-through of the circuit board by a guiding of the drive device and the control unit toward one another. Since the connecting element is generally fixedly connected to the drive device, i.e., to the motor, by a guiding toward one another, i.e., by positioning the motor in relation to the control unit, it is possible to feed the connecting element through the lead-through. This enables a simple assembly of the components in relation to one another.

In one embodiment of the manufacturing method according to the present invention, the connecting element may be introduced through an at least one assigned opening in the housing of the control unit into the interior of the housing. The opening in this case may be present in an upper side of the housing, which is placed onto a housing underside of the housing. In this way, it is possible to place the motor with connected upper side and underside onto a previously sealed control unit. With the placement, the at least one connecting element passes through the housing into the interior of the control unit, the connecting element also extending through the circuit board where—as previously described—it is contacted with the aid of the circuit board via the deflection arrangement.

In one embodiment of the manufacturing method, the circuit board is accommodated in the housing of the control unit, in particular, in a bottom part of the housing. This has the advantage that the circuit board is positioned at the correct location, so that during assembly the connecting element is able to pass through the at least one opening or lead-through provided in the circuit board.

Specific embodiments of the present invention are described below with reference to the figures.

DETAILED DESCRIPTION

Figure 1:
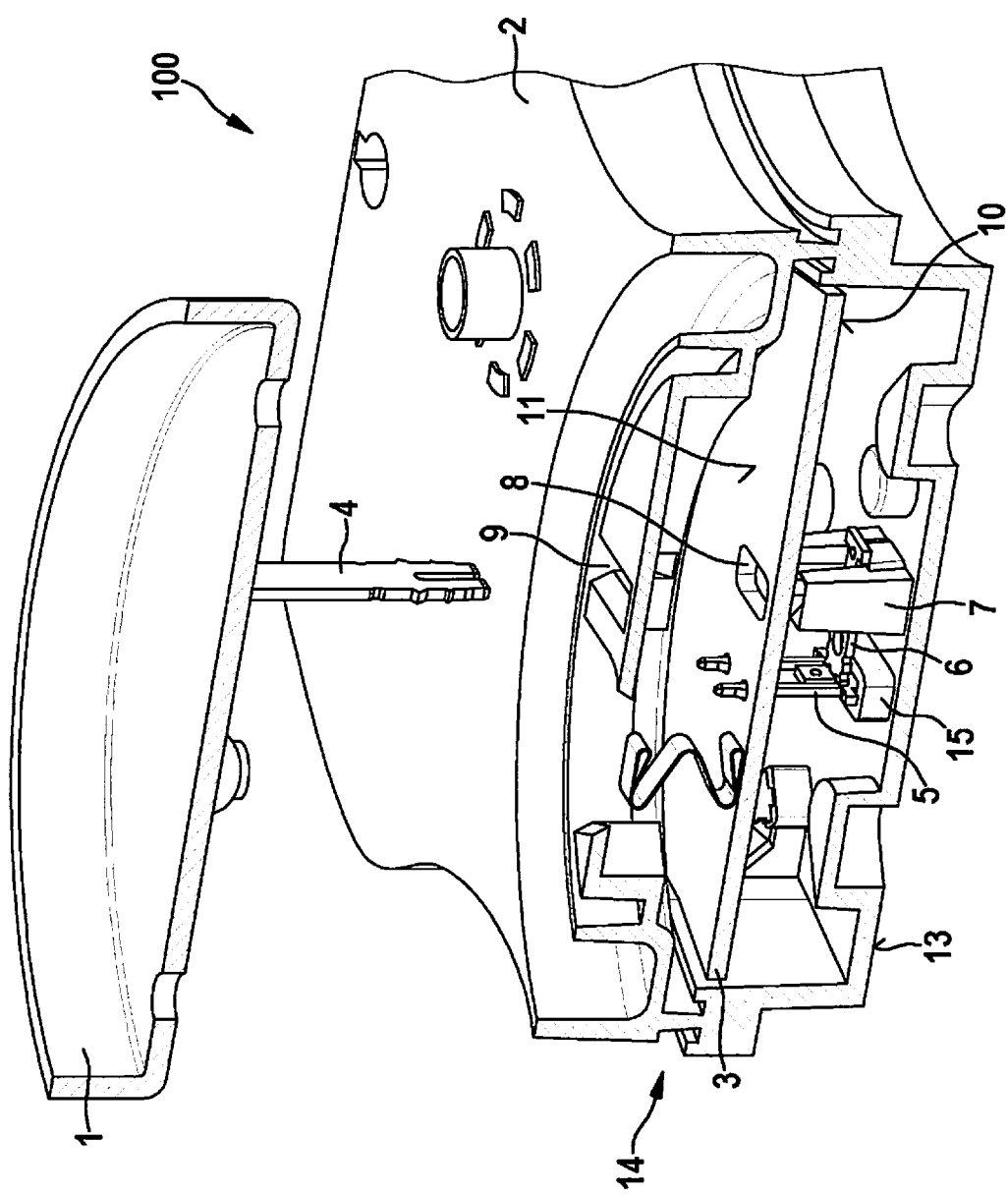
FIG. 1 shows a drive device, including a control unit as well as part of a drive unit.

FIG. 1 shows a motor unit 100. Motor unit 100 may be made up of a control unit 2, as well as a drive device 1. Control unit 2 includes a circuit board 3. Circuit board 3 may, for example, be a circuit carrier, which includes electrical circuits used to activate motor 1. Circuit board 3 is accommodated in the interior of a housing 14 of control unit 2. Only a part of drive device 1, in particular, a housing of drive device 1, is shown in the figures.

Circuit board 3 includes an upper side 11 as well as an underside 10. Upper side 11 in this case may be a side of circuit board 3 that faces motor 1. Underside 10 faces away from motor 1.

It is provided to bring motor 1 into electrical contact with circuit board 3. An electrical contacting of motor 1 by circuit board 3 is to take place from underside 10 of circuit board 3.

In the following, it is explained how a contacting of motor 1 by circuit board 3 may take place from underside 10.

When assembling motor unit 100, a drive unit 1—i.e., a motor 1—is generally guided toward control unit 2. Control unit 2 may, of course, also be moved toward drive unit 1. Drive unit 1 and control unit 2 may be connected to one another in a known manner using different fastening measures. Thus, for example, adhering, screwing or also welding housings of drive device 1 and control unit 2 together is conceivable.

Drive unit 1 may include a connecting contact 4. Connecting contact 4 may also be understood to mean connecting element 4. Connecting contact 4 may be introduced into the interior of control unit 2 when moving drive unit 1 and control unit 2 toward one another. Connecting contact 4 may be introduced into the interior of control unit 2 through an opening 9 in housing 14 of control unit 2. The opening in this case may be provided in a cover of housing 14.

The exemplary embodiment is described below with a description of a contacting of a single connecting element 4, which is provided through an opening in the cover of housing 14. It is clear, however that multiple connecting elements 4 may also be used in the assembly of motor unit 100, each of which is to be contacted by circuit board 3. For this purpose, multiple openings 9 in the housing may, of course, be used, each of these being available for connecting elements 4. In this case, a one-to-one assignment between connecting elements 4 and opening 9 may be provided. Multiple connecting elements 4 may also pass via a shared opening 9 into the interior of the housing.

During assembly, connecting element 4 is first located above upper side 11 of circuit board 3 in the interior of housing 14 of control unit 2. Circuit board 3 further includes an opening 8 or also a lead-through 8, through which connecting element 4 of motor 1 may be fed. Through lead-through 8, it is possible to feed connecting element 4 from upper side 11 to underside 10 of circuit board 3. In this way, connecting element 4 of motor 1 passes below circuit board 3. To bring connecting element 4 into electrical contact with circuit board 3 coming from below, i.e., coming from underside 10 of circuit board 3, connecting element 4 is contacted by circuit board 3 via an electrically conductive connection 5, 6. In the case of lead-throughs 8 as well, it is clear that multiple lead-throughs 8 may be provided in circuit board 3, through which respective connecting element 4 may be fed. It is also possible for multiple connecting elements 4 to be fed through a shared lead-through.

In FIG. 1, this electrically conductive connection is made up of an electrically conductive contact element 6, which extends essentially in parallel to circuit board 3 inside housing 14. Contact element 6 is able to contact connecting element 4 in a contact area 6a (see FIG. 2) of contact element 6.

It is clear that in the case of multiple connecting elements 4, multiple contact elements 6 may accordingly also be provided.

A pin 5 is connected in an electrically conductive manner to another section—in FIG. 1 at the end—of contact element 6. Contact element 6 may be connected to pin 5 in such a way that contact element 6 is inserted into and spot-welded in pin 5.

Connecting element 4 is connected to circuit board 3 via pin 5, which is also connected in an electrically conductive manner to connecting element 4 with the aid of contact element 6. Pin 5 may be pressed into circuit board 3 in a known manner.

In the case of multiple connecting elements 4 and multiple contact elements 6, it is accordingly possible to provide multiple pins 5, which contact circuit board 3 at different points.

Housing 14 of control unit 2 may include an underside 13. Underside 13 includes at least one receptacle 15, 7, which accommodates pin 5, contact element 6, as well as connecting element 4.

In the case of multiple connecting elements 4 and multiple contact elements 6, as well as pins 5, it is accordingly possible to provide multiple receptacles 15, 7.

Two different receptacles, for example, are delineated in FIG. 1, on the one hand, a receptacle 15 for pin 5, as well as a receptacle 7 for contact element 6. Receptacles 15, 7 are suitable for holding or also fixing the respective components. Receptacles 15, 7 are also further suitable for absorbing forces or for supporting forces. Pin 5 may, for example, be fixedly connected to receptacle 15. Contact element 6 may be mounted, in particular in its front area, in a corresponding receptacle 7. Since in order to bring connecting element 4 into electrical contact with contact element 6, connecting element 4 must be pressed onto the contact element, contact element 6 requires a force support in the assembly direction of connecting element 4. Details in this regard are shown in the additional figures.

Receptacle 7 may further be suitable for laterally guiding connecting element 4 if connecting element 4 is moved toward contact element 6. It is also possible for opening 9 in housing 14 of control unit 2 to ensure a lateral guidance for connecting element 4 during assembly. Thus, connecting element 4, when correctly aligned during assembly, is able to pass through opening 9 and lead-through 8 to underside 10 of circuit board 3, where connecting element 4 is contacted by contact element 6. The connecting element comes into electrically conductive contact with circuit board 3 via contact element 6 as well as pin 5.

Figure 2:
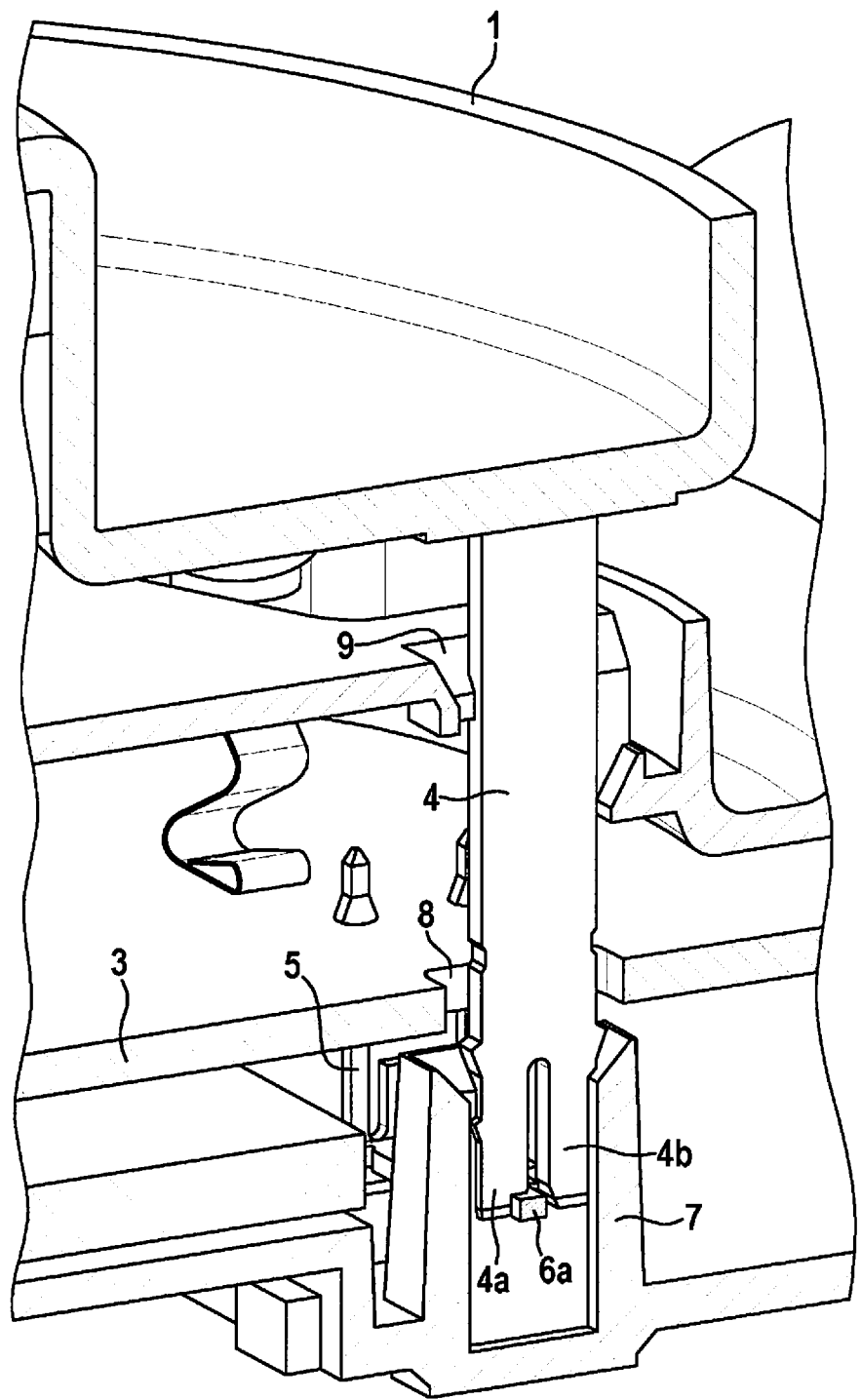
FIG. 2 shows a cross section through the control unit.

FIG. 2 shows another view of motor unit 100. In this view, connecting element 4 is already further introduced into the interior space of housing 14 of control unit 2. As is apparent, connecting element 4 already extends through opening 9 of housing 14 and through lead-through 8 of circuit board 3.

In FIG. 2 as well, only a single connecting element 4 is depicted. Specific embodiments having multiple connecting elements 4 in analogous contact are, of course, possible. The same applies to FIGS. 3 through 5 described further below.

Connecting element 4 is at least partly accommodated in receptacle 7. Pin 5 is apparent in the rear area of the housing, which is connected to circuit board 3 in an electrically conductive manner. Pin 5 is further connected via contact element 6 to connecting element 4.

As previously mentioned, contact element 6 includes a contact area 6a. This contact area 6a is accommodated between two flanks 4a and 4b of connecting element 4. In other words, connecting element 4 may be pushed or pressed onto contact element 6 during the installation of motor unit 100. During this pushing, flanks 4a, 4b of connecting element 4 each pass onto one side of contact element 6 in contact area 6a.

Figure 3:
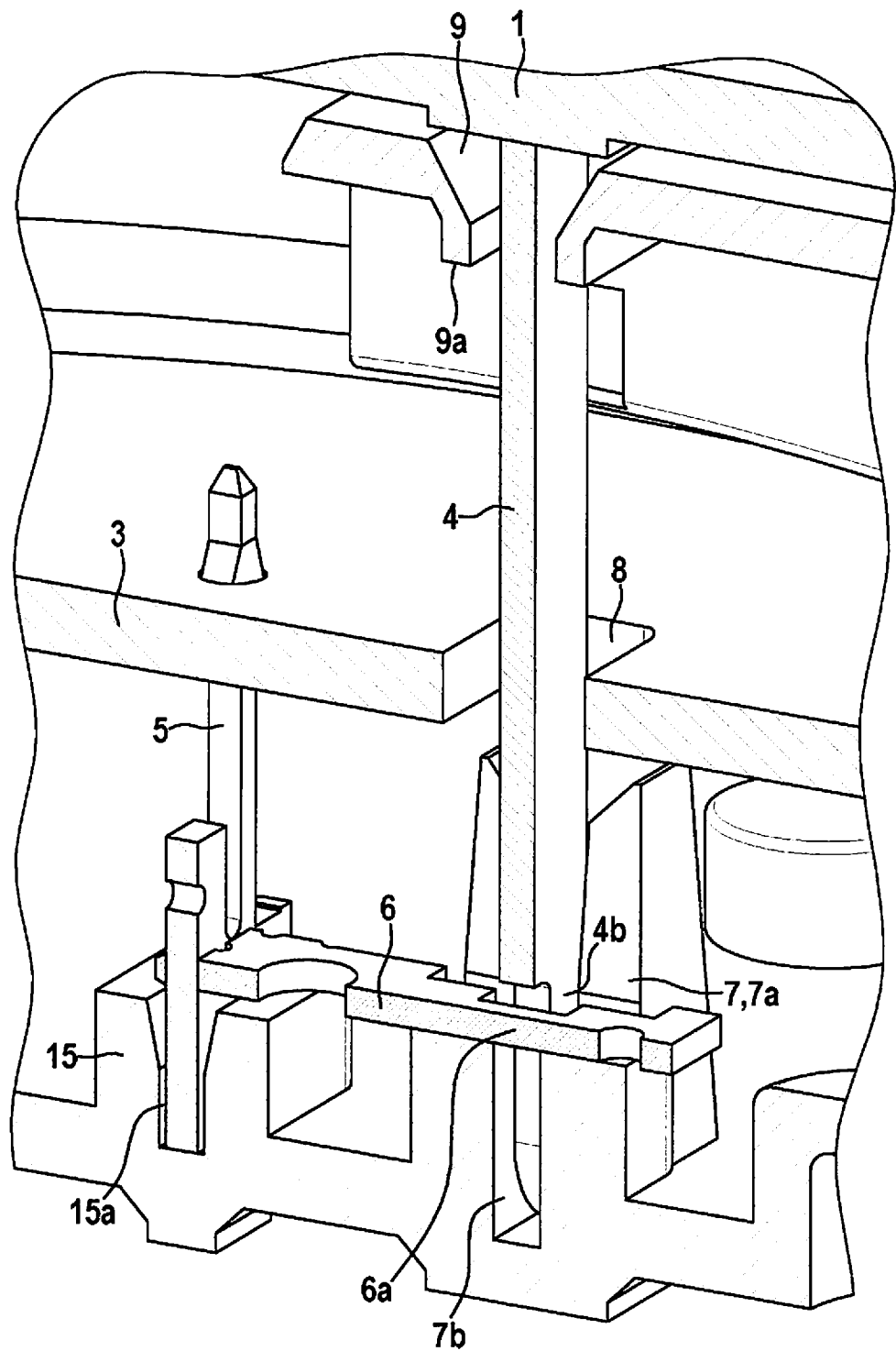
FIG. 3 shows a cross section through the control unit with details of the electrical contacting.

FIG. 3 shows another sectional view of a detail of motor unit 100, in which connecting element 4 is connected to contact element 6 which, in turn, is connected to pin 5 and thus also to circuit board 3 in an electrically conductive manner.

It is apparent in this view that the connecting element is introduced through opening 9 of housing 14 of control unit 2. Sides 9a of opening 9 in this case guide connecting element 4. It is also apparent how connecting element 4 protrudes through lead-through 8 of circuit board 3. Receptacle 7 is also more clearly shown in this sectional view.

Receptacle 7 includes a pocket 7B, into which connecting element 4 dips during assembly. Receptacle 7 further includes two lateral guides 7A in order to laterally stabilize connecting element 4.

A recess may optionally be provided on the flank 4b shown, which may engage with contact element 6 in contact area 6a in order to establish the electrical contact between contact element 6 and connecting element 4.

Receptacle 15 for pin 5 also includes a pocket 15a, which stabilizes pin 5.

Figure 4:
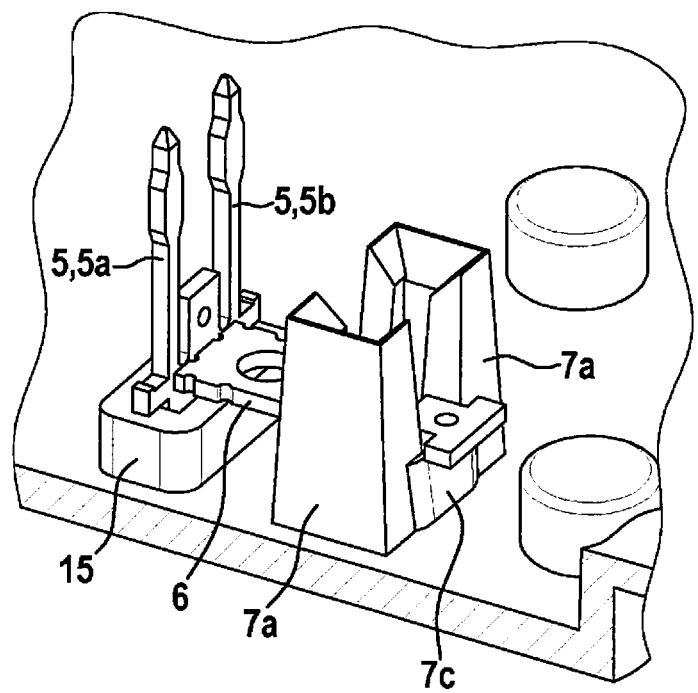
FIG. 4 shows details of the electrical contacting in the control unit.
Figure 5:
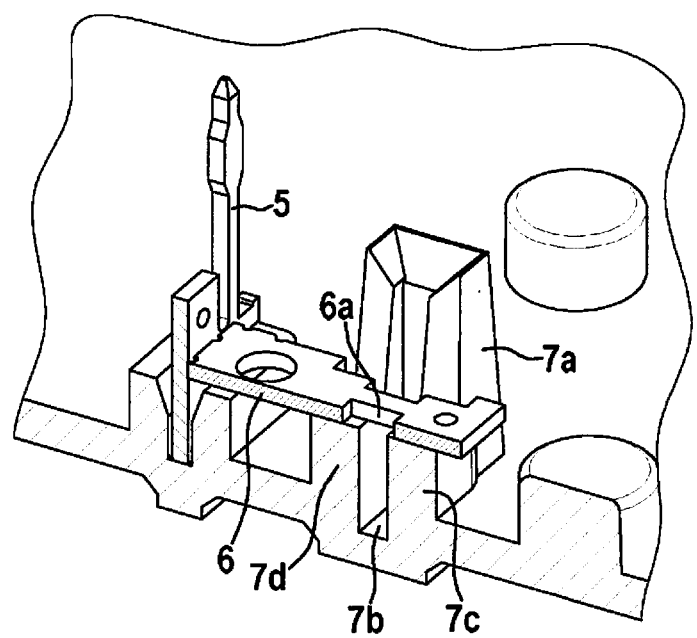
FIG. 5 shows details of the electrical contacting in the control unit.

FIGS. 4 and 5 show details of control unit 2 of motor unit 100. The details of FIGS. 4 and 5 show no circuit board 3 in order to once again highlight more clearly the details of receptacles 7, 15.

FIG. 4 shows lateral guides 7a for connecting element 4. It is further apparent that receptacle 7 also includes a support 7c, on which contact element 6 rests. It is further apparent how pin 5 is fixed in receptacle 15 for pin 5. Pocket 15a as well as pocket 7b of respective receptacles 15, 7 are not apparent in this view.

FIG. 5 in turn shows a section, in which details of receptacle 7 are shown. Lateral guides 7a for connecting element 4 are apparent, as is support 7c for contact element 6 and pocket 7b, which accommodates connecting element 4. Contact area 6a of contact element 6 is located in the area of lateral guide 7a and of pocket 7b. At this point, flanks 4a and 4b of connecting element 4 must be able to encompass contact area 6a of contact element 6. In FIG. 5, it is further apparent that a support 7d is present, which is also able to accommodate contact element 6 in the form of a shelf. Shelves 7c and 7d of receptacle 7 ensure a stable support of contact element 6, when the contact element is contacted by connecting element 4 via force-fitting.

Figure 6:
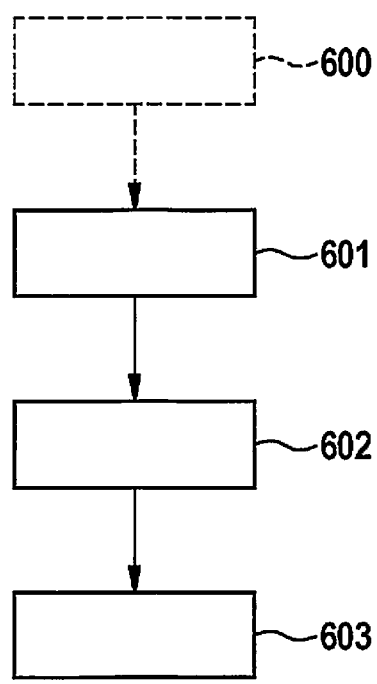
FIG. 6 shows a flow chart of a manufacturing method for a motor device.

FIG. 6 describes a manufacturing method for a motor unit 100. It is assumed that underside 13 of housing 14 of control unit 2 is prepared for assembly.

Pin 5 as well as contact element 6 are already introduced in underside 13 of housing 14. This may take place—as described above—via corresponding receptacles 7, 15 in housing 14, in particular, in housing lower part 13 of housing 14. As previously described, pin 5 and contact element 6 may also be inserted in one piece as combination pin 5, 6. Pin 5 and contact element 6 may also be inserted in a preliminary step 600 of the manufacturing method.

In a step 601 of the manufacturing method, circuit board 3 is inserted into underside 13 of housing 14. During insertion, one end of pin 5 is press-fitted into the corresponding opening of circuit board 3. In this way, pin 5 is conductively connected to electrical components of circuit board 3.

Housing 14 is closed in a step 602. In the process, a corresponding upper side is placed on underside 13 of housing 14 and connected to underside 13 in a suitable manner.

In a step 603, drive device, i.e., electric motor 1, is then placed on housing 14 of control unit 2. When placing motor 1 onto control unit 2, the at least one connecting element 4 is introduced into the interior of housing 14. This takes place—as previously described—through opening 9 of housing 14. When introducing connecting element 4 into housing 14, connecting element 4 is fed through a lead-through 8 in circuit board 3. Thus, connecting element 4 passes from a side of circuit board 3 facing drive device 1 to a side of circuit board 3 facing away from drive device 1.

Connecting element 4 is accommodated below circuit board 3 by guides 7a in underside 13 of housing 14. Connecting element 4, guided by guides 7a, slides in the direction of contact area 6a of contact element 6 as motor 1 is mounted on control unit 2.

By applying a force in the assembly direction, flanks 4a and 4b of connecting element 4 pass laterally around contact area 6a. In the process, flanks 4a and 4b are plastically deformed in order to adapt to the width of contact area 6a. The remaining elastic tension in flanks 4a and 4b generates a residual contacting force between flanks 4a and 4b and contact area 6a. A plastic deformation may be understood to mean an outward bending of flanks 4a and 4b.

A contacting of connecting element 4 from underside 13 on circuit board 3 is possible due to the configuration and guidance of connecting element 4 during installation and due to the electrical connection of connecting element 4 to circuit board 3 via contact element 6 and pin 5.

The electrical connection via contact element 6 and pin 5 takes place via two tips 5a, 5b of pin 5. These pin tips 5a, 5b are shown, for example, in FIG. 4. By using two pin tips 5a and 5b, it is possible to increase the current carrying capacity. The cross section of a pin 5 for contacting should be in a certain relation to the thickness of the circuit board to be contacted. Assuming a thickness of the circuit board, for example, of approximately 1.6 mm, then a single pin 5 may not be arbitrarily sized. However, not only two pin tips 5a and 5b, but also three or more pin tips could also be used in parallel.

The forces to be applied during the assembly are absorbed by corresponding mating elements, i.e., for example, by supports 7d and 7c for contact element 6, and thus prevent a bending of contact element 6 during assembly.

In the manufacturing method as well, it is of course possible for multiple connecting elements 4 to be used and to be accordingly involved in the contacting of the circuit board.

The specific embodiments of the figures have been described with reference to a connecting element, which is to be connected via a contact element to a corresponding point of the circuit board. Depending on the number of connections of the motor to be contacted, the control unit may include multiple contacting options for a corresponding number of connecting elements of the motor. Thus, for example, three connecting elements may be provided for activating a three-phase motor which—as demonstrated in the specific embodiments described—are contacted at three points of the circuit board.

What is claimed is:

1. A control unit for activating a drive device, comprising:
 a circuit board to be contacted by at least one connecting element of the drive device; and
 at least one lead-through for the at least one connecting element;
 wherein the circuit board is contactable by the drive device from a contacting side via the at least one connecting element, the contacting side facing away from the drive device, wherein:
  the control unit includes at least one deflection arrangement, which is situated in the control unit on the contacting side of the circuit board, the deflection arrangement being contactable by the circuit board from the contacting side and by the at least one connecting element of the drive device,
  at least one receptacle for the at least one deflection arrangement is on an underside of a housing of the control unit,
  the at least one deflection arrangement includes a contacting area for contacting the at least one connecting element, the at least one receptacle including a contacting receptacle, in which the contacting area is accommodated,
  the at least one connecting element is at least partly in the contacting receptacle, and
  the contacting of the contacting area of the at least one deflection arrangement is establishable by the at least one connecting element in the contacting receptacle.

2. The control unit of claim 1, wherein the at least one lead-through is configured so that the at least one connecting element is feed-able from a mounting side of the circuit board through the at least one lead-through to the contacting side, the mounting side of the circuit board facing the drive device.

3. The control unit of claim 1, wherein the contacting is establishable by pressing the at least one connecting element onto the contacting area in the contacting receptacle.

4. The control unit of claim 1, wherein the at least one connecting element to be contacted is guidable through a housing opening of a housing of the control unit, in each case assigned to the at least one connecting element, in particular, through a housing opening, which faces a mounting side of the circuit board.

5. A method for manufacturing a motor unit, the method comprising:
 providing a control unit; and
 providing a drive device;
 wherein the control unit includes a circuit board to be contacted by at least one connecting element of the drive device, and the circuit board includes at least one lead-through for the connecting element assigned to the at least one connecting element, and wherein the circuit board is contacted by the drive device via the at least one connecting element from a contacting side, the contacting side facing away from the drive device, being contacted so that the at least one connecting element is guided through the at least one opening of the circuit board, wherein:

the control unit includes at least one deflection arrangement, which is situated in the control unit on the contacting side of the circuit board, the deflection arrangement being contactable by the circuit board from the contacting side and by the at least one connecting element of the drive device, at least one receptacle for the at least one deflection arrangement is on an underside of a housing of the control unit, the at least one deflection arrangement includes a contacting area for contacting the at least one connecting element, the at least one receptacle including a contacting receptacle, in which the contacting area is accommodated, the at least one connecting element is at least partly in the contacting receptacle, and the contacting of the contacting area of the at least one deflection arrangement is establishable by the at least one connecting element in the contacting receptacle.

6. The method of claim 5, wherein the guiding of the at least one connecting element through the at least one opening of the circuit board takes place by guiding the drive device and the control unit toward one another.

7. The method of claim 5, wherein the circuit board is contacted by the at least one connecting element via at least one deflection element, which is situated in the control unit on the contacting side of the circuit board, and wherein the deflection arrangement is contacted by the circuit board from the contacting side on the one hand, and by the connecting element of the drive device on the other hand.

8. The method of claim 5, wherein at least one connecting element is also introduced through at least one opening in a housing of the control unit, the opening being in an upper side of a housing, which is placed on an underside.

9. The method of claim 8, wherein the circuit board is in the underside of the housing.

10. A control unit for activating a drive device, comprising:

a circuit board to be contacted by at least one connecting element of the drive device; and at least one lead-through for the at least one connecting element;

wherein the circuit board is contactable by the drive device from a contacting side via the at least one connecting element, the contacting side facing away from the drive device, wherein the control unit includes at least one deflection arrangement, which is situated in the control unit on the contacting side of the circuit board, the deflection arrangement being contactable by the circuit board from the contacting side and by the at least one connecting element of the drive device, wherein at least one receptacle for the at least one deflection arrangement is on an underside of a housing of the control unit, and wherein the deflection arrangement includes one of electrically conductive pins and contact pieces.

11. The control unit of claim 10, wherein the connecting element is connected to circuit board via at least one of the electrically conductive pins.

12. The control unit of claim 10, wherein the receptacle 15 includes a pocket that stabilizes the electrically conductive pins.

13. A motor unit, comprising:

a drive device; and a control unit;

wherein the drive device includes at least one connecting element, which is contacted by a circuit board of the control unit, wherein the circuit board is contacted by at least one connecting element of the drive device, wherein there is at least one lead-through for the at least one connecting element, and wherein the circuit board is contactable by the drive device from a contacting side via the at least one connecting element, the contacting side facing away from the drive device, wherein:

the control unit includes at least one deflection arrangement, which is situated in the control unit on the contacting side of the circuit board, the deflection arrangement being contactable by the circuit board from the contacting side and by the at least one connecting element of the drive device, at least one receptacle for the at least one deflection arrangement is on an underside of a housing of the control unit, the at least one deflection arrangement includes a contacting area for contacting the at least one connecting element, the at least one receptacle including a contacting receptacle, in which the contacting area is accommodated, the at least one connecting element is at least partly in the contacting receptacle, and the contacting of the contacting area of the at least one deflection arrangement is establishable by the at least one connecting element in the contacting receptacle.

* * * * *